(12) United States Patent
Subramaniam et al.

(10) Patent No.: US 7,236,640 B2
(45) Date of Patent: Jun. 26, 2007

(54) FIXED, VARIABLE AND ADAPTIVE BIT RATE DATA SOURCE ENCODING (COMPRESSION) METHOD

(75) Inventors: Anand D. Subramaniam, La Jolla, CA (US); Bhaskar D. Rao, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 826 days.

(21) Appl. No.: 10/344,586

(22) PCT Filed: Aug. 17, 2001

(86) PCT No.: PCT/US01/25838

§ 371 (c)(1),
(2), (4) Date: Apr. 28, 2003

(87) PCT Pub. No.: WO02/17538

PCT Pub. Date: Feb. 28, 2002

(65) Prior Publication Data

US 2004/0049384 A1  Mar. 11, 2004

Related U.S. Application Data

(60) Provisional application No. 60/226,137, filed on Aug. 18, 2000.

(51) Int. Cl.
*G06K 9/36* (2006.01)
*G06K 9/38* (2006.01)
*G06K 9/46* (2006.01)
*G10L 19/12* (2006.01)
*G10L 21/00* (2006.01)
*H04N 7/12* (2006.01)
*H04N 11/02* (2006.01)
*H04N 11/04* (2006.01)

(52) U.S. Cl. .................... 382/253; 382/251; 348/422.1; 704/222

(58) Field of Classification Search ................ 382/232, 382/239, 251, 253; 348/420.1, 422.1; 704/222
See application file for complete search history.

(56) References Cited

U.S. PATENT DOCUMENTS 5,091,945 A * 2/1992 Kleijn ........................ 704/219

(Continued)

OTHER PUBLICATIONS

Chen et al. ("Image Sequence Coding Using Adaptive Finite-State Vector Quantization," IEEE Trans. Circuits and Systems for Video Technology, vol. 2, No. 1, Mar. 1992, pp. 15-24).*

(Continued)

*Primary Examiner*—Matthew C. Bella
*Assistant Examiner*—Yubin Hung
(74) *Attorney, Agent, or Firm*—Greer, Burns & Crain, Ltd.

(57) ABSTRACT

According to the invention, quantization encoding is conducted using the probability density function of the source, enabling fixed, variable and adaptive rate encoding. To achieve adaptive encoding, an update is conducted with a new observation of the data source, preferably with each new observation of the data source, preferably with each new observation of the data source. The current probability density function of the source is then estimated to produce codepoints to vector quantize the observation of the data source.

14 Claims, 4 Drawing Sheets

U.S. PATENT DOCUMENTS 5,671,327 A * 9/1997 Akamine et al. ............ 704/219
5,680,508 A * 10/1997 Liu ............................. 704/227
6,438,268 B1 * 8/2002 Cockshott et al. .......... 382/253
6,807,527 B1 * 10/2004 Rozhdestvenskij et al. . 704/223

OTHER PUBLICATIONS

Feng et al., "Dynamic Codebook adaptive Vector Quantization for Image Coding," IEEE Trans. Consumer Electronics, vol. 45, Iss. 2, May 1999, pp. 327-332.*

Fowler et al., "Adaptive Vector Quantization of Image Sequences Using Generalized Threshold Replenishment," IEEE Int'l Conf on Acoustics, Speech and Signal Processing, Apr. 21-24, 1997, vol. 4, pp. 3085-3088.*

Duda & Hart, Pattern Classification and Scene Analysis, Wiley, 1973, pp. 31-32 & 44-49.*

Wang, et al. "Vector Quantization Using Adaptive Codebook," IEEE Int'l Conf. on Communications, V 3, Jun. 1998, pp. 1350-1354.*

William R. Gardner, Bhaskar D. Rao, "Theoretical Analysis of the High-Rate Vector Quantization of LPC Parameters", *IEEE Transactions on Speech and Audio Processing*, vol. 3, No. 5, Sep. 1995, pp. 367-381.

Robert M. Gray, "Quantization", *IEEE Transactions on Information Theory*, vol. 44, No. 6, Oct. 1998, pp. 2325-83.

Kuldip K. Paliwal, Bishnu S. Atal, "Efficient Vector Quantization of LPC Parameters at 24 Bits/Frame", *IEEE Transactions on Speech and Audio Processing*, vol. 1., No. Jan. 1993, pp. 3-14.

Dae Gwon Jeong, Jerry D. Gibson, "Uniform and Piecewise Uniform Lattice Vector Quantization for Memoryless Gaussian and Laplacian Sources", *IEEE Transactions on Information Theory*, vol. 39, No. 3, May 1993, pp. 786-804.

W.P. LeBlanc, B. Bhattacharya, S.A. Mahmoud, V. Cuperman, "Efficient Search and Design Procedures for Robust Multi-Stage VQ of LPC Parameters for 4 kb/s Speech Coding", *IEEE Transactions on Speech and Audio Processing*, vol. 1, No. 4, Oct. 1993, pp. 373-385.

Wai-Yip Chan, Allen Gersho, "Enhanced Multistage Vector Quantization with Constrained Storage", *IEEE Trans. on Comm.*, Nov. 1992, pp.659-663.

Dirk Ormoneit, Volker Tresp, "Averaging, Maximum Penalized Likelihood and Bayesian Estimation for Improving Gaussian Mixture Probability Density Estimates", *IEEE Transactions on Neural Networks*, vol. 9, No. 4, Jul. 1998, pp. 639-650.

Jianping Pan, Thomas R. Fischer, "Vector Quantization of Speech Line Spectrum Pair Parameters and Reflection Coefficients", *IEEE Transactions on Speech and Audio Processing*, vol. 6, No. 2, Mar. 1998, pp. 106-115.

Richard A. Redner, Homer F. Walker, "Mixture Densities, Maximum Likelihood and the EM Algorithm", *SIAM Review*, vol. 26, No. 2, Apr. 1984, pp. 195-239.

Peter W. Moo, David L. Neuhoff, "Optimal Compressor Functions for Multidimensional Companding", *IEEE Int'l Symp. on Info. Theory*, Jun. 29- Jul. 4, 1997, p. 515.

Antonio Ortega, "Adaptive Scalar Quantization Without Side Information," *IEEE Transactions on Image Processing*, vol. 6, No. 5, May 1997, pp. 665-676.

Mikael Skoglund, Nam Phamdo, Fady Alajaji, "Hybrid Digital--Analog Source--Channel Coding for Bandwidth Compression/Expansion", *IEEE Transactions on Information Theory*, vol. 52, No. 8, Aug. 2006, pp. 3757-63.

Christopher F. Barnes, Syed A. Rizvi, Nasser M. Nasrabadi, "Advances in Residual Vector Quantization: A Review", *IEEE Transactions on Image Processing*, vol. 5, No. 2, Feb. 1996, pp. 226-262.

* cited by examiner

FIXED, VARIABLE AND ADAPTIVE BIT RATE DATA SOURCE ENCODING (COMPRESSION) METHOD

PRIORITY CLAIM

This application claims convention priority under from prior U.S. provisional application Ser. No. 60/226,137, filed Aug. 18, 2000.

TECHNICAL FIELD

The field of the invention is data encoding, transmission, and decoding. The invention is applicable to data source encoding, i.e., compression.

BACKGROUND ART

Data source encoding reduces the amount of bandwidth and resources required for transmission of a particular data source. Significant reductions are achieved by compression, especially in data sets exhibiting patterns. Image data and speech data are two exemplary data types upon which data source encoding is especially useful. Both produce large quantities of data that exhibit patterns rendering possible an efficient compression.

Quantization schemes used for data source encoding evaluate a data source for rendering an intelligent encoding of the data based upon the statistics of the data source. Conventional data source encoding schemes design a quantizer using a large database of the source known as the training data. The training data is typically selected to encompass all possible statistics of the data source, i.e., the transmission encoded data. The balance in designing a succesful quantizer is a balance between perfomance and complexity. However, when the quantizer is designed to perform reasonably well for all possible source statistics, it will not be optimal for a given realization of a source.

Other problems are unaddressed by conventional quantization data source encoding schemes. The conventional schemes are not able to adapt with time-varying statistics of a data source. In addition, bandwidth efficient adaptation is generally unfeasable due the enormous memory costs associated because it would be typically necessary to store data from the beginning of transmission to adapt the quantizer to the current statistics of the source. Then, even if the quantizer can be modified to depict current statistics of the source, it would typically be necessary to transmit the entire data encoding codebook to the receiver. This is a prohibitive bandwidth expense. Such conventional schemes do not provide for the possibility of variable rate encoding that holds promise in wireless code division multiple access (CDMA) communication environments.

Many quantization encoding schemes also have considerable computational and search complexity in the nonadaptive case. The memory and computation costs of vector quantizers grows exponentially with bit rate. Such costs have lead to the employment of sub-optimal quantizers even for sources with large databases to provide sufficient statistical information for optimal quantization.

DISCLOSURE OF THE INVENTION

The present invention addresses problems inherent in the conventional quantization encoding schemes. According to the invention, quantization encoding is conducted using the probability density function of the source, enabling fixed, variable and adaptive rate encoding. To achieve adaptive encoding, an update is conducted with a new observation of the data source, preferably with each new observation of the data source. The current probability density function of the source is then estimated to produce codepoints to vector quantize the observation of the data source.

BEST MODE OF CARRYING OUT THE INVENTION

Encoding of the invention is particularly significant for use with any non-stationary (time-varying) data source. Fixed and variable bit rate encoders are possible with the invention. However, the invention also provides computational savings for encoding of stationary data sources. The invention, using the probability density function of an observation of a data source, efficiently produces codepoints for vector encoding the data source. The computational expense for the encoder does not require a search through the entire set of possible codepoints. The disclosure will focus upon the adaptive capabilities of the encoding of the invention, while artisans will appreciate is broader applicability.

Figure 1:
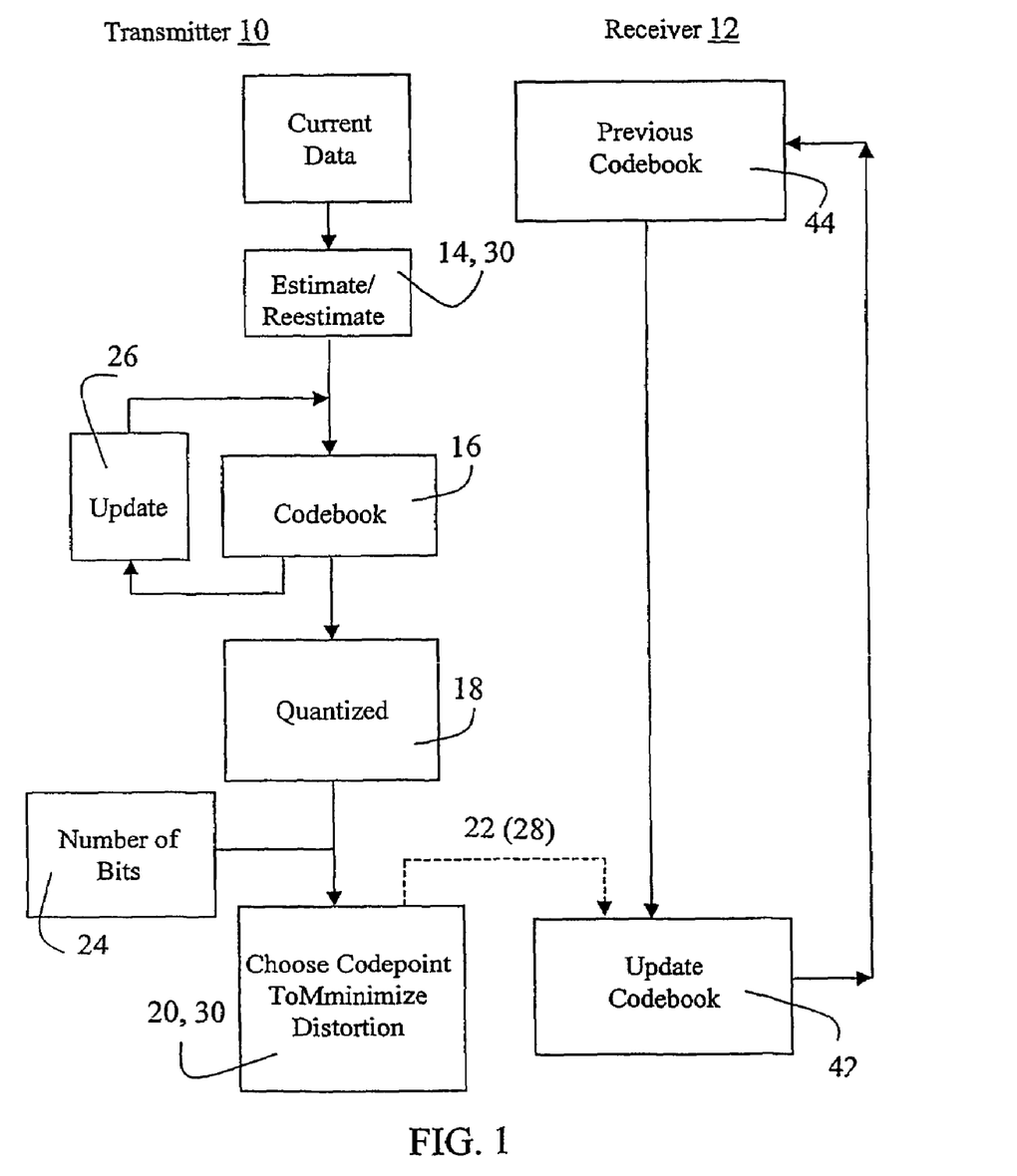
FIG. 1 is a block diagram illustrating encoding conducted in accordance with the invention.
Figure 2A:
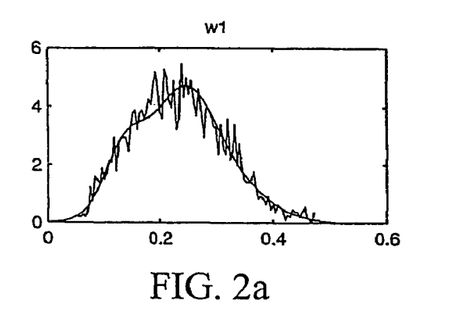
FIGS. 2(a)–2(j) are plots indicating the goodness of fit of a density estimate in accordance with the invention applied to vector quantization of Speech LPC parameters.
Figure 2B:
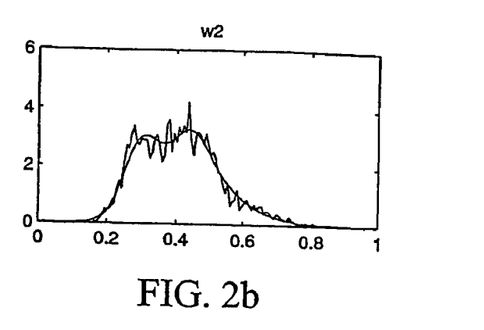
Figure 2C:
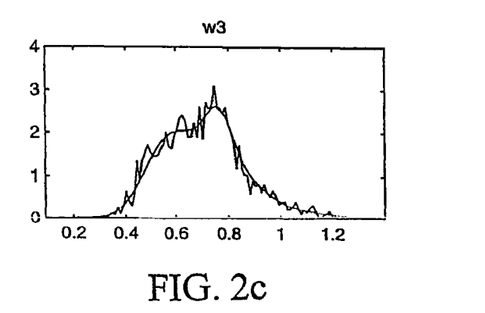
Figure 2D:
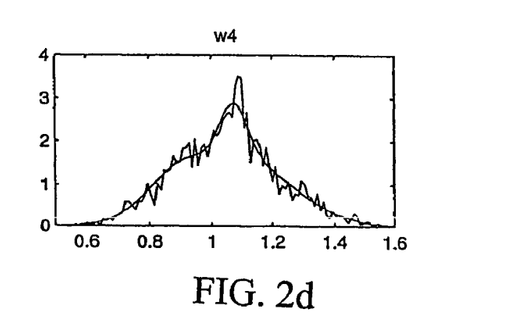
Figure 2E:
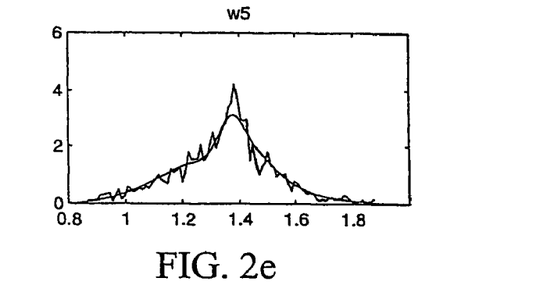
Figure 2F:
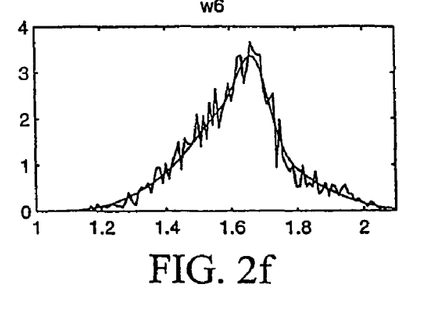
Figure 2G:
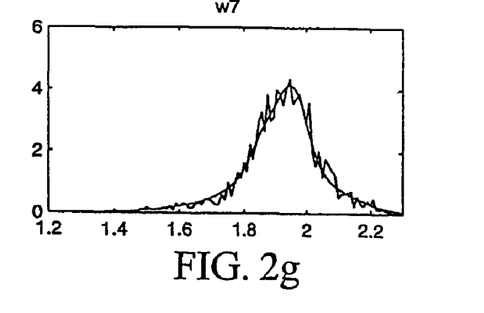
Figure 2H:
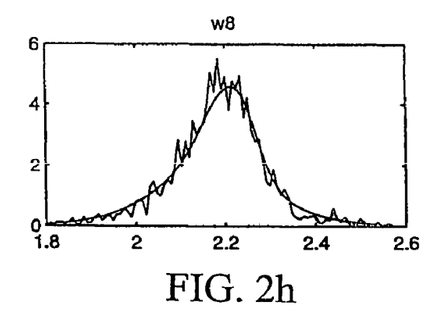
Figure 2I:
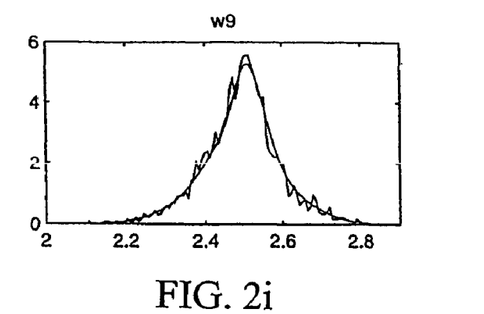
Figure 2J:
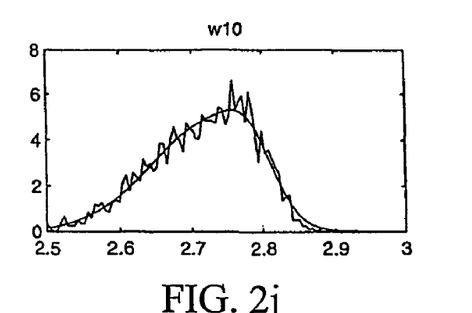

Generally, as seen in FIG. 1, current data from a data source of a transmitter 10 results in the transmission of a set of model parameters of a probability density function to a receiver 12. The model parameters are sufficient to produce or update a set of codepoints at the receiver. In the adaptive case, each update transmits the current model paramaters. From the perspective of an encoder in the transmitter 10, knowing the current parametric model parameters for the probability density function is equivalent to knowing the current optimal quantizer of the data source. The number of model parameters needed to obtain the updated quantizer are very small in comparison to the size for the codebook which would be required to perform adaptive quantization by conventional techniques.

For the purposes of further detailed discussion of the encoding performed in the transmitter 10, a mathematical expression of the parametric density is convenient. $\Omega_k$ is an observation of a p-dimensional non-stationary random data source at time instant k. $\Omega_k$ may be modeled as an iid (independent and identically distributed) realization of a parametric density, i.e., $$f(\Omega_k \mid \Phi) = \sum_{i=1}^{m} \alpha_i f_i(\Omega_k \mid \Phi_i)$$

$$\Phi = [m, \alpha_1, \ldots, \alpha_m, \Phi_1, \ldots, \Phi_m]$$

$\alpha_i$ are non-negative constants and $$\sum_{i=1}^{m} \alpha_i = 1 \quad f_i(\cdot \mid \Phi_i)$$

will be referred to as cluster i and is an individual parameteric density parameterized by $\Phi_i$. According to the invention, quantization encoding adapts to time-varying probability density function of the source. The current probability density function of the source is estimated using a parametric model. Parameters are obtained with each observation. Accordingly, only the model parameters are necessary to produce a new set of codepoints, which may be considered as an updated codebook.

In a specific preferred embodiment of the invention a codebook limited to the set of codepoints determined through an observation or previous observations of a data source is maintained for encoding data observations from a data source. Upon arrival of new data from the data source, a current estimate of probability density function model parameters of the data-source are determined by applying a re-estimation algorithm to a previous estimate of the model parameters and the new data. The codebook is then updated using the model parameters m is the number of clusters. $\Phi$ is the parameter set which defines the parametric model. $\Omega_k$ may be assumed to have been generated by one of the m clusters and the probablity that a given obervation has been generated by cluster i is $\alpha_i$. A density estimation algorithm is used to estimate 14 the parametric model parameters from the current data of the data source.

Once density has been estimated, a separate codebook is designed 16 for each of the clusters. The number of bits allocated to a specific cluster i, $b_i$ depends upon whther the communciation system is a fixed rate or variable rate system. Efficient bit allocation techniques and transform coding techniques are used to allocate bits to clusters, using an appopriate number of bits to be allocated for a particular cluster according to the particular fixed rate or variable rate system requirements. A given observation $\Omega_k$ is quantized by identifying an appropriate cluster among the m clusters and quantizing it using the codebook of that cluster. Let $b_{tot}$ represent the total number of bits used to quantize the parametric model density. $D_i(b_i)$ represent the mean square distortion of an optimal $b_i$ bit quantizer of cluster i.

A fixed rate codebook design bit allocation scheme may employ the invention. A bit allocation in the fixed rate case may be decided by minimizing the total average distortion given that the total number of codepoints used for quantizing the parametric model density is fixed. The minimization is given by:

$$\min_{bi} D_{tot} = \sum \alpha_i D_i(b_i), \text{ subject to } 2^{b_{tot}} = \sum_{i=1}^{m} 2^{b_i}$$

The solution to this constrained optimization problem is used as the bit allocation scheme for the fixed rate case. Under reasonable conditions, the solution to the above constrained problem may be easily obtained in closed form.

Data encoding in the fixed rate case-is simple; A given observation is quantized 18 using all the clusters to obtain m prospective candidates. The quantization of the given obervation by a particular cluster can be accomplished in an efficient manner, i.e., the number of searches used to locate the nearest codepoint is considerably smaller than the number of searches required for a full search (i.e., searching over all codepoints in the codebook). Then, a codepoint that minimizes relevant distortion is chosen 20 from amongst the m probables. The transmitter 10 sends 22 that codepoint to the receiver.

A variable rate codebook design is also possible with the invention to achieve variable bit rate allocation. A bit allocation for the variable rate codebook design may be decided by minimizing the total average distortion given that the average rate of the quantizer is fixed, i.e., $$\min_{bi} D_{tot} = \sum \alpha_i D_i(b_i), \text{ subject to } b_q = \sum_{i=1}^{m} \alpha_i b_i$$

where $b_q = b_{tot} - b_c$ is the total number of bits less the number of bits required to identify a particular cluster ($b_c$). As is the case for the fixed rate scheme, the constrained optimization problem can be solved in closed form under reasonable assumptions. One possible choice for is $b_c$ is $$b_c = \sum_{i=1}^{m} \log_2(m).$$

Observations belong to clusters with varying probabilities. Accordingly, Huffman coding, for example, may be used to identify the cluster which can produce bit rate savings. In this case $$b_c \approx \sum_{i=1}^{m} -\alpha_i \log_2(\alpha_i).$$

Encoding is similar to the fixed rate case. The same general steps are applied with quantizing 18 to obtain m prospective candidates and choosing 20 a codepoint to minimize distortion. The number of bits is determined 24. If the codepoint chosen to minimize distortion belongs to cluster i, then $b_k = b_c + b_i$ bits are used to quantize the given observation. Bit rate savings may be accomplished by removing the temporal correlation of the source by using conventional decorrelation techniques such as linear prediction. Decorrelated output is then quantized as described above. For the purpose of curtailing error propagation, error control-may be performed by loading the quantization error of a particular deccorelated vector on the next decorrelated vector and then quantizing it.

In either the fixed or variable rate case, the arrival of new data creates a density update 26 that results in only model parameters 28 being used to update the codebook. On arrival of new data from the source (current data), the current estimate of the model parameter is determined 30 from a re-estimation algorithm that uses the previous estimate of the model parameters and current data to obtain the current estimate of the model parameters. Since only data since the last update is used, memory costs can be minimal in practice.

An exemplary application of the invention is to the vector quantization of speech LPC (Linear Prediction coefficients) parameters. This is a nonlimiting, specific example use. As mentioned above, the invention is applicable in general to the source coding of any non-stationary source, as well as stationary data sources. Speech data is typically broken down into frames of sizes 20–24 millisecondes each. An optimal $p^{th}$ order linear predictor is calculated for each of these speech frames (typically p=10). Line Spectral Frequencies (LSF) are one-to-one transformations of the LPC parameters which result in a set of parameters that can be efficiently quantized (using, for example, a scalar quantizer) while maintaining stability. Speech LSF's are modeled in the example as iid realizations of a multi-variate normal misture density. This particular type of modeling is motivated by the fact that gaussian kernels have a well-recorded history of being effective basis functions for functional approximations. The mixture model parameters are efficently estimated using the Expectation Maximization (EM) algorithm. In experiments, a tenth order predictor was used. This leads to an LSF vector that is ten dimensional. The source probability density is estimated using a mixture density of 15 clusters. FIGS. 2(a)–2(j) show the goodness of the fit of the density estimate. Each plot compares estimated marginal density of a component of the LSF vector with the true marginal density of that component. The plots indicate that the estimation algorithm does an excellent job of modeling the probability density function of the source.

Figure 3:
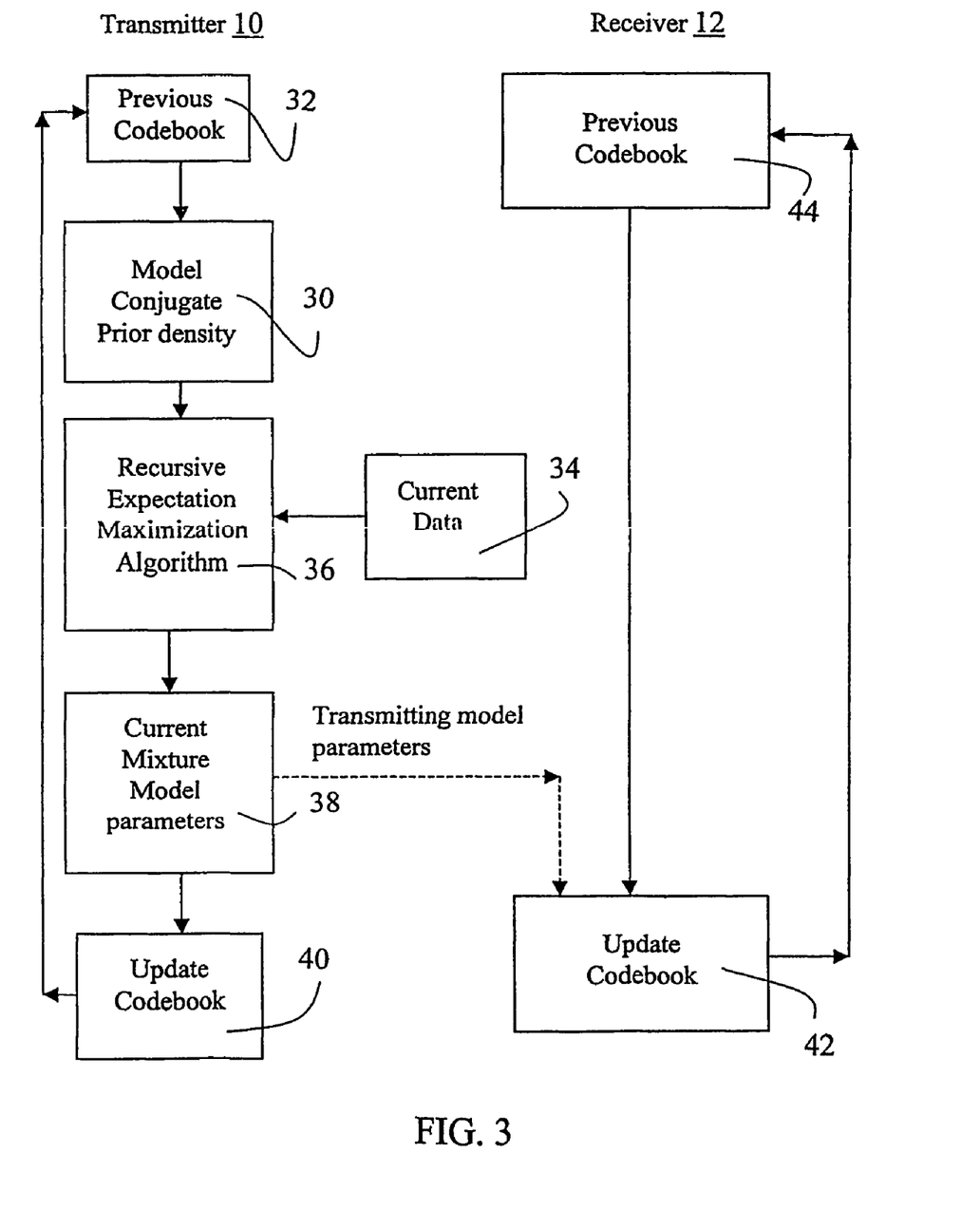
FIG. 3 is a block diagram indicating application of the invention to the exemplary Speech LPC parameter vector quantization problem.

The general bit allocation scheme of the invention as discussed with reference to FIG. 1 may be applied after the mixture model parameters for the speech data are determined. For a particular cluster, a codebook is built by transform coding and-optimal bit allocation techniques. FIG. 3 illustrates the general steps performed by the speech coder applying the invention. Referring to the transmitter 10, the re-estimation procedure uses the previous model parameters to model a conjugate prior to the multi-variate density. Prior density 30 from the previous codebook 32 are used with the current data 34 by a recursive expectation maximization algorithm 36. The recursive expecation maximization algorithm produces an estimate of the current model parameters 38 (The Gaussian mixture model) that are then used to update the codebook 40. The current model parameters, preferably in the form of an index to a codepoint, which then produces an updated codebook 42 from its previous codebook 44 based upon the current model parameters.

Various additional steps may be performed with the invention, which could be incorporated as part of the general method of FIG. 1 or any of its potential specific applications, e.g., the speech data learning environment encoder of FIG. 3. Perceptual weighting is one possible additional step. Weighted distortion measures are commonly used because they are demonstrated to be perceptually important. As an example, artisans have demonstrated that the optimal weighting matrix for LSF quantization in order to minimize the average spectral distortion is diagonal and relacted to the inverse of the covariance matrix. Weighting matrices are easy to incorporate in the present invention. As an example, a weight $w_i$ may be used to produce an optimal bit allocation among cluster components for a cluster i when the optimal weighting matrix for cluster i is $w_i$.

Normal expectation maximization algorithms sometimes perform inefficiently due to overfitting. In conducting a density estimate to carry out the invention, this problem may be addressed by averaging techniquies to reduce the number of iterations and/or improve accuracy in producing a density estimate. Various suitable techniques may be employed, including averaging using so-called bagging techniques, maximum penalized likelihood and Bayesian estimation. In addition, the invention might use parametric densities that are tuned to a particular application for modelling purposes.

Various methods of performing quantization of individual cluster components. One possibility is a look-up table of optimal quantizers for the particular parametric density at different bit rates. Another possibility is to build a large tree structured quantizer on the particular parametric density and cut back rate using a BFOS algorithm. Yet another possibility is to use lattice quantizers.

An alternative also exists to further reduce bandwidth requirements for transmission of model parameters with each update. A differential approach could be carried out. Namely, instead of sending the complete set of model parameters for the receiver to update its codebook a differential set of model parameters could be sent. The differential set would only include those parameters which have changed significantly since the last update.

Receiver/decoder design is straightforward and admits of many possible variations. Any suitable form of look-up or other manner of determining the data vector from a received codepoint index is appropriate and may he used with an encoder/transmitter of the invention.

Artisans will accordingly appreciate several advantages of quantization encoding of a source in accordance with the invention. The invention is bandwidth efficient since only model parameters, or even a sufficient subset of model parameters (e.g., differential parameters), is sent with each update. The current estimate of the model parameters are representative of the current data, representing an improvement of conventional non-adaptive techniques. Both fixed rate and variable rate encoding are possible.

While various features and embodiments of the invention have thus been described, the invention is not limited thereto. Instead the scope of the invention is to be understood from the appended claims and legal equivalents thereto.

Various features of the invention are set forth in the following claims.

What is claimed is:

1. A method for vector encoding a data source, the method comprising:
   taking an observation of the data source;
   estimating the probability density function from the data observation;
   determining codepoints for vector encoding the data source based upon the estimated probability density function from the data source.

2. The method for encoding according to claim 1, further comprising a step of transmitting an index of a determined codepoint to a receiver.

3. The method for encoding according to claim 2, further comprising a step of repeating said steps of estimating, determining with each observation of current data from the data source.

4. The method for encoding according to claim 1, wherein said step of estimating comprises:
   quantizing an observation of current data from the data source using all data clusters of the current data to obtain m prospective candidates;
   choosing a codepoint from among the m prospective candidates that minimizes relevant distortion; and
   transmitting an index of the codepoint to the receiver.

5. The method for encoding according to claim 1, wherein said step of estimating comprises:
   quantizing an observation of current data from the data source using all data clusters of the current data to obtain m prospective candidates;
   choosing a codepoint from among the m prospective candidates that minimizes relevant distortion; then
   identifying the cluster which is used to quantize the observation and using the number of bits allocated to the cluster to obtain the index in the variable-rate case.

6. The method according to claim 1, further comprising a preliminary step of decorrelating output of the data source.

7. The method for encoding according to claim 1, further comprising a step of transmitting the set of model parameters to a receiver.

8. A method for encoding a non-stationary data source, the method comprising steps of:
  upon arrival of new data from the data source, determining a current estimate of probability density function model parameters of the data source by applying a re-estimation algorithm to a previous estimate of the model parameters and the new data; and
  updating a set of codepoints using the model parameters.

9. A method for encoding a non-stationary data source, the method comprising steps of:
  taking an observation $\Omega_k$ of a p-dimensional non-stationary random data source at time instant k;
  modelling $\Omega_k$ as an independent and identically distributed realization of a parametric density, according to:

$$f(\Omega_k \mid \Phi) = \sum_{i=1}^{m} \alpha_i f_i(\Omega_k \mid \Phi_i)$$

$$\Phi = [m, \alpha_1, \ldots, \alpha_m, \Phi_1, \ldots, \Phi_m]$$

where, $\alpha_1$ are non-negative constants and $$\sum_{i=1}^{m} \alpha_i = 1 \quad f_i(\cdot \mid \Phi_i)$$

is referred to as cluster i and is an individual parameteric density parameterized by $\Phi_i$, m is the number of clusters, $\Phi$ is the parameter set which defines a parametric model, $\Omega_k$ may be assumed to have been generated by one of the m clusters, and the probablity that a given obervation has been generated by cluster i is $\alpha_i$;
  estimating, by a density estimation algorithm, parametric model parameters of the parametric model from the current observation of the data source;
  designing a separate codebook for each of the m clusters, allocating bits to clusters according to one of a fixed or variable rate; then, upon each arrival of new data resulting in a new observation $\Omega_{k-new}$, updating the codebook for each of the m clusters by
  determining a current estimate of parametric model parameters of the data source by applying a re-estimation algorithm to a previous estimate of the model parameters and the new data; and
  updating the separate codebook for each of the m clusters using the model parameters.

10. The method according to claim 9, wherein an observation $\Omega_k$ is quantized by identifying an appropriate cluster among the m clusters and quantizing it using the codebook of that cluster.

11. The method according to claim 10, further comprising steps to fixed rate encode the new data, wherein $b_{tot}$ represent the total number of bits used to quantize the parametric model density and $D_i(b_i)$ represent the mean square distortion of an optimal $b_i$ bit quantizer of cluster i, the steps to fix rate encode comprising:
  allocating bits in said step of designing by minimizing total average distortion given that a total number of codepoints used for quantizing parametric model density is fixed, according to:

$$\min_{bi} D_{tot} = \sum \alpha_i D_i(b_i), \text{ subject to } 2^{b_{tot}} = \sum_{i=1}^{m} 2^{b_i}$$

and, then, quantizing the observation $\Omega_k$ using all clusters to obtain m prospective candidates;
  choosing a codepoint that minimizes relevant distortion is chosen from amongst the m probables; and
  updating the codebook of all clusters.

12. The method according to claim 10, further comprising steps to variable rate encode the new data, wherein $b_{tot}$ represent the total number of bits used to quantize the parametric model density and $D_i(b_i)$ represent the mean square distortion of an optimal $b_i$ bit quantizer of cluster i, the steps to fix rate encode comprising:
  allocating bits allocation for a variable rate codebook by minimizing total average distortion according to:

$$\min_{bi} D_{tot} = \sum \alpha_i D_i(b_i), \text{ subject to } b_q = \sum_{i=1}^{m} \alpha_i b_i$$

where $b_q = b_{tot} - b_c$ is a total number of bits less a number of bits required to identify a particular cluster ($b_c$);
  and, then, quantizing the observation $\Omega_k$ using all clusters to obtain m prospective candidates;
  choosing a codepoint that minimizes relevant distortion is chosen from amongst the m probables; and
  updating the codebook of all clusters.

13. The method according to claim 11, wherein $b_c = \log_2 m$.

14. The method according to claim 12, wherein $$b_c \approx \sum_{i=1}^{m} -\alpha_i \log_2(\alpha_i).$$

* * * * *

UNITED STATES PATENT AND TRADEMARK OFFICE
CERTIFICATE OF CORRECTION

| | |
|---|---|
| PATENT NO. | : 7,236,640 B2 |
| APPLICATION NO. | : 10/344586 |
| DATED | : June 26, 2007 |
| INVENTOR(S) | : Subramaniam et al. |

It is certified that error appears in the above-identified patent and that said Letters Patent is hereby corrected as shown below:

Column 4, line 46, please delete "control-may" and insert --control may-- therefor.

Column 5, line 23, please delete "and-optimal" and insert --and optimal-- therefor.

Signed and Sealed this

Twentieth Day of November, 2007

JON W. DUDAS
*Director of the United States Patent and Trademark Office*